US011444474B1

(12) United States Patent
Namuduri et al.

(10) Patent No.: US 11,444,474 B1
(45) Date of Patent: Sep. 13, 2022

(54) APPARATUS FOR MOBILE POWER SOURCE

(71) Applicant: GM Global Technology Operations LLC, Detroit, MI (US)

(72) Inventors: Chandra S. Namuduri, Troy, MI (US); Benjamin Christian, Plymouth, MI (US); Thomas W. Nehl, Shelby Township, MI (US); Rashmi Prasad, Troy, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 0 days.

(21) Appl. No.: 17/194,828

(22) Filed: Mar. 8, 2021

(51) Int. Cl.
| | |
|---|---|
| *H02J 7/00* | (2006.01) |
| *H02M 7/00* | (2006.01) |
| *H05K 7/20* | (2006.01) |
| *H02M 7/44* | (2006.01) |
| *H02M 1/14* | (2006.01) |
| *H02J 7/35* | (2006.01) |
| *H02M 1/44* | (2007.01) |

(52) U.S. Cl.
CPC .......... *H02J 7/0068* (2013.01); *H02J 7/0048* (2020.01); *H02J 7/35* (2013.01); *H02M 1/14* (2013.01); *H02M 1/44* (2013.01); *H02M 7/003* (2013.01); *H02M 7/44* (2013.01); *H05K 7/20927* (2013.01)

(58) Field of Classification Search
CPC .......... H02J 7/0068; H02J 7/0048; H02J 7/35; H02J 7/00; H02M 1/14; H02M 1/44; H02M 7/003; H02M 7/44; H02M 7/00; H05K 7/20927; H05K 7/20
See application file for complete search history.

(56) References Cited

U.S. PATENT DOCUMENTS

| | | | | |
|---|---|---|---|---|
| 2013/0293163 | A1* | 11/2013 | Flett | ........................ B60L 53/20 318/139 |
| 2021/0376634 | A1* | 12/2021 | Smith | ................... H02M 1/007 |

FOREIGN PATENT DOCUMENTS

CN 201611854 U * 10/2010

* cited by examiner

*Primary Examiner* — Robert L Deberadinis
(74) *Attorney, Agent, or Firm* — Vivacqua Crane PLLC

(57) ABSTRACT

A mobile power source apparatus includes a mobile unit having a platform structure, a frame connected to the platform structure and multiple wheels rotatably connected to the platform structure to promote moving the mobile unit. An electronics power module is connected to a DC power source defining a high voltage DC battery. The electronics power module converts DC energy of the DC battery to at least one of an alternating current (AC) power and a direct current (DC) power. A wireless communication device promotes wireless communication of a battery state-of-charge (SOC) of the high voltage DC battery. A liquid cooling thermal system provides positive cooling of the electronics power module.

18 Claims, 10 Drawing Sheets

APPARATUS FOR MOBILE POWER SOURCE

INTRODUCTION

The present disclosure relates to mobile power sources providing supplemental electrical power to ground located aircraft.

Mobile power sources are commonly made available to equipment such as aircraft which are on the ground during periods of system precheck and to provide system operation for air conditioning or heat load. Known mobile power sources are commonly powered by a diesel engine driven alternating current (AC) generator which are coupled to AC to AC or AC to direct current (DC) converters to supply appropriate current and voltage.

Diesel engine driven mobile power sources incur multiple drawbacks. These include low efficiency, pollution created by burning fossil fuels as well as limitation to outside use due to soot and carbon monoxide production, high noise output, and a large space envelope. The space envelope is further increased due to use of an air-cooled thermal system. A further drawback derives from use of low frequency magnetics in the power conversion system which increases a space envelope and further detracts from operating efficiency.

Thus, while current mobile power sources achieve their intended purpose, there is a need for a new and improved mobile power source and method for operation of a mobile power source.

SUMMARY

According to several aspects, a mobile power source apparatus includes a mobile unit having a platform structure. A frame connected to the platform structure supports a towing adapter to move the mobile unit. Multiple wheels rotatably connected to the platform structure promote moving the mobile unit. An electronics power module connected to a DC power source defines a high voltage DC battery. The electronics power module converts DC energy of the DC battery to at least one of an alternating current (AC) power and a direct current (DC) power. The electronics power module also controls recharging of the battery.

In another aspect of the present disclosure, a power electronics configuration of a high voltage battery charging system of an AC power source to DC power provides power delivery to a vehicle. An input side provides power from a one-phase grid which can be a 120 VAC, 60 Hz source; or a 240 VAC, 60 Hz source. The one-phase grid is tied to an on-board-charging-module converting the AC power source to a DC current, the DC current fed into a first power distribution unit (PDU).

In another aspect of the present disclosure, the input side further includes a first three-phase grid providing a 208 VAC, 60 Hz power to a first transformer-rectifier unit whose output is connected to the first PDU. A second three-phase grid provides a 480 VAC, 60 Hz power to a second transformer-rectifier unit whose output is connected to the first PDU. A third three-phase grid provides a 200 VAC, 400 Hz power to a third transformer-rectifier unit whose output is connected to the first PDU.

In another aspect of the present disclosure, an AC Power Module (ACPM) accepts a battery voltage at input terminals (BAT+, BAT−) and provides a galvanically isolated and regulated 3-phase 400 Hz AC output that is selected to be 120V/200 VAC or 240V/400 VAC rms. The ACPM includes multiple disconnect relays, inrush-current limiting through a pre-charge circuit including an EMI and battery current ripple filter input. A PWM inverter and a high frequency transformer are followed by a rectifier and a DC ripple filter to generate a galvanically isolated and regulated DC voltage. The DC voltage is converted to a 3-phase 400 Hz AC by a space vector PWM inverter. An output of the space vector PWM inverter is passed through multiple output AC ripple filters to produce pure sinusoidal 3-phase AC voltages.

In another aspect of the present disclosure, a wireless communication device promotes wireless communication of a battery state-of-charge (SOC) of the high voltage DC battery for remote monitoring and to identify an available charging condition of the mobile unit prior to deployment.

In another aspect of the present wide band-gap power semi-conductor switches including GaN or SiC switches operating at switching frequencies above audible range (>16 kHz), field service lifting features are integrated with the electronics power module.

In another aspect of the present disclosure, a safety interlock feature prevents moving the mobile unit when it is plugged into a load or a charger.

In another aspect of the present disclosure, wide band-gap power semi-conductor switches include GaN or SiC switches operating at switching frequencies above audible range (>16 kHz).

In another aspect of the present disclosure, at least one transformer defines at least one high power density transformer operating at a frequency greater than 4 kHz.

In another aspect of the present disclosure, the high voltage DC battery defines a selectable DC energy storage system having a first 400 VDC battery and a second 400 VDC battery. A 400V option is provided by positioning a first switch connected across a negative terminal side of the first 400 VDC battery and the second 400 VDC battery in a closed position. A second switch is connected across a positive terminal side of the first 400 VDC battery and the second 400 VDC battery in a closed position and a third switch is connected to the negative terminal side of the first 400 VDC battery and the positive terminal side of the second 400 VDC battery in an open position. An 800V option is provided by positioning the first switch in an open position, the second switch in an open position and the third switch in a closed position.

According to several aspects, a mobile power source apparatus includes a mobile unit having a platform structure, a frame connected to the platform structure and multiple wheels rotatably connected to the platform structure to promote moving the mobile unit. An electronics power module is connected to a DC power source defining a high voltage DC battery. The electronics power module converts DC energy of the DC battery to at least one of an alternating current (AC) power and a direct current (DC) power. A wireless communication device promotes wireless communication of a battery state-of-charge (SOC) of the high voltage DC battery. A liquid cooling thermal system provides positive cooling of the electronics power module.

In another aspect of the present disclosure, a high voltage DC energy storage unit is cooled using a first cold plate heat sink. A power electronics package is cooled using a second cold plate heat sink.

In another aspect of the present disclosure, a DC Power Module (DCPM) accepts a battery voltage at input terminals (BAT+, BAT−) and provides a galvanically isolated and regulated DC output selected to either 270V or 28V. The DCPM includes: multiple battery disconnect relays with inrush-current limiting through a pre-charge circuit; an EMI filter and a battery current ripple filter; a PWM inverter; and a HF transformer followed by a rectifier and a DC ripple filter to generate a galvanically isolated and regulated DC voltage.

In another aspect of the present disclosure, a solar charging system provided with the mobile unit charges the high voltage DC battery.

In another aspect of the present disclosure, the solar charging system includes: a solar panel; a DC-to-DC converter connected to the solar panel; a power electronics package connected to the high voltage DC battery; and an output port and a charge port provided with the power electronics package.

In another aspect of the present disclosure, a towing adapter is releasably connected to a towing vehicle used to move the mobile unit.

In another aspect of the present disclosure, the liquid cooling thermal system includes: a pump inducing flow of a liquid coolant; and a radiator providing for heat transfer of heat from the liquid coolant to atmosphere.

According to several aspects, a method for generating power using a mobile power source apparatus, comprising: connecting a frame of a mobile unit to a platform structure and rotatably connecting multiple wheels to the platform structure to promote moving the mobile unit; providing an electronics power module connected to a DC power source defining a high voltage DC battery, and converting DC energy of the DC battery to at least one of an alternating current (AC) power and a direct current (DC) power using the electronics power module; wirelessly communicating a battery state-of-charge (SOC) of the high voltage DC battery using a wireless communication device; and positively cooling the electronics power module using a liquid cooling thermal system.

In another aspect of the present disclosure, the method further includes connecting a solar charging system with the mobile unit to charge the high voltage DC battery.

In another aspect of the present disclosure, the method further includes selecting one of: a DC Power Module (DCPM) accepting a battery voltage at input terminals (BAT+, BAT−) and providing a galvanically isolated and regulated DC output selected to either 270V or 28V; or an AC Power Module (ACPM) accepting a battery voltage at the input terminals (BAT+, BAT−) and providing a galvanically isolated and regulated 3-phase 400 Hz AC output that is selected to be 120V/200 VAC or 240V/400 VAC rms.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
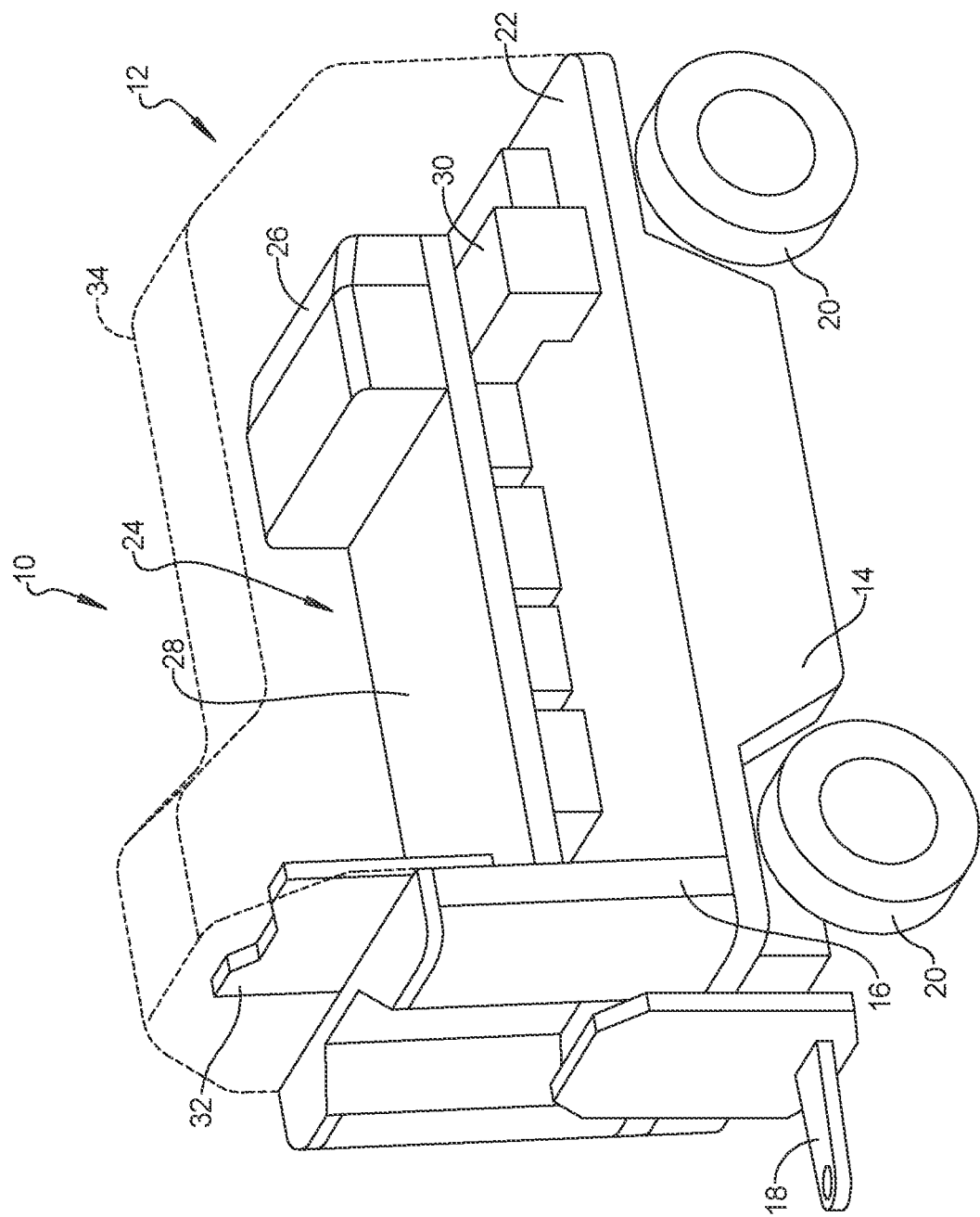
FIG. 1 is a front left perspective view of a mobile unit according to an exemplary aspect.

Referring to FIG. 1, a mobile power source apparatus 10 of the present disclosure includes a mobile unit 12 having a platform structure 14. A frame 16 connected to the platform structure 14 supports a towing adapter 18 releasably connected to a towing vehicle (not shown) used to move the mobile unit 12. Multiple wheels 20 are rotatably connected to the platform structure 14 which promote moving the mobile unit 12. A platform deck 22 provided with the platform structure 14 supports components of a high power density electrical apparatus 24 defining a mobile power source.

According to several aspects the electrical apparatus 24 includes an electronics power module 26 connected to a DC power source defining a high voltage DC energy storage system or battery 28 defined herein as a battery of 400 VDC or greater voltage. The power module 26 converts DC energy of the battery 28 to an alternating current (AC) power or a direct current (DC) power. The electronics power module 26 also controls recharging of the battery 28. To promote positive and regulated cooling a liquid cooling system 30 may also be supported on the platform deck 22 to cool components of the electrical apparatus 24, the DC energy storage system and the battery 28 during energy conversion and transfer, and battery charging. A heat transfer device 32 such as a convective coolant radiator may be provided for removing heat from a coolant flowing through the liquid cooling system 30 to atmosphere. A protective cover 34 shrouds the electrical apparatus 24 and acts as an environmental barrier against weather, atmospheric conditions and prevents inadvertent access to components of the electrical apparatus 24.

Referring to FIG. 2 and again to FIG. 1, in addition to the electronics power module 26 and the battery 28, the electrical apparatus 24 further includes a VICM (Vehicle Integration Control Module) 36 also defining a battery management system which controls operating conditions of the battery 28. A supplemental battery 38 such as a known 12 VDC lead-acid battery may also be provided to generate house-keeping power for operation of a controller discussed in reference to FIG. 4. A manual service disconnect 40 is provided to manually isolate the battery 28. The manual service disconnect 40 may also function as or include a safety interlock feature to prevent moving the mobile unit 12 when it is plugged into a load or a charger. As an additional feature, the electronics power module may include field service lifting features 41 integrated with the energy storage and power electronics. To enable the safety interlock feature of the manual service disconnect 40, a main system controller 108 described in reference to FIG. 4 may receive a signal from an OBCM (Onboard Charging Module) 42 communicated to the VICM (Vehicle Integration Control Module) 36 by the CAN bus network 120 also described in greater detail in reference to FIG. 4, and a 28V interlock on the power converter or module 26, to disable a mobile unit parking brake, a lock pin, or to enable a towing unit or vehicle drive mode.

A charging port is provided with the OCBM 42 for connection to an external power source (not shown) for recharging the battery 28 and the supplemental battery 38. A wireless communication device 43 may be provided to promote wireless communication of a battery state-of-charge (SOC), for example the SOC of the battery 28 for remote monitoring and to identify an available charging condition of the mobile unit 12 prior to deployment. A 3-phase charging cable 44 is stored in the mobile unit 12 and is dispensed for a vehicle charging operation and retracted back to the stored position shown after use. A liquid cooling thermal system 45 provides positive cooling of components of the electrical apparatus 24. The liquid cooling thermal system 45 also promotes thermal pre-conditioning of DC energy storage devices such as Li batteries for optimal performance.

Figure 2:
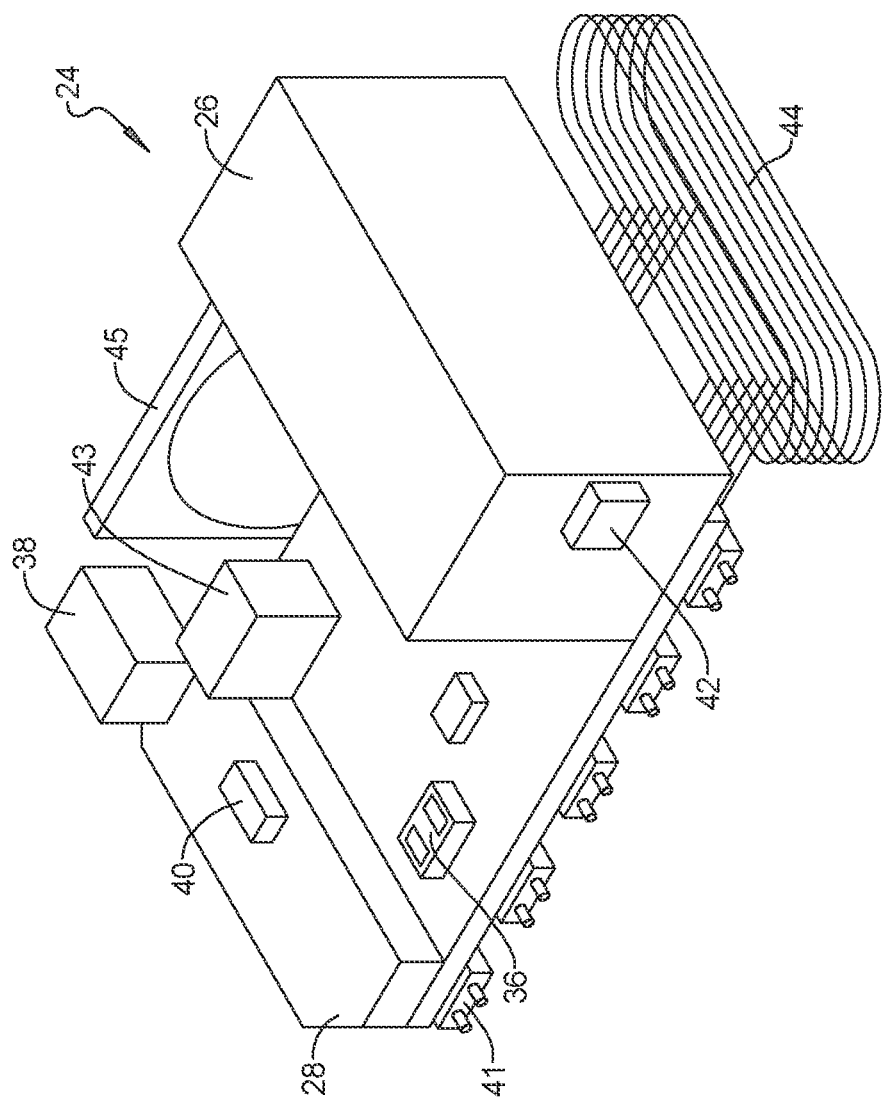
FIG. 2 is a rear left perspective view of high power density electrical apparatus of the mobile unit.

Referring to FIG. 3 and again to FIGS. 1 through 2, a power electronics configuration is presented to provide efficient and high power density with galvanic isolation for a high voltage battery charging system (AC to DC) and for power delivery to a vehicle such as an aircraft (DC to AC, or DC to DC). An input side 46 provides power from a one-phase grid 48 which can be 120 VAC, 60 Hz source; or 240 VAC, 60 Hz source. The one-phase grid 48 is tied to an on-board-charging-module 50 which converts the AC power source to a DC current which is fed into a first power distribution unit (PDU) 52. Also provided on the input side 46 is a first three-phase grid 54 providing a 208 VAC, 60 Hz power to a first transformer-rectifier unit 56, whose output is connected to the first PDU 52. The input side 46 further includes a second three-phase grid 58 providing a 480 VAC, 60 Hz power to a second transformer-rectifier unit 60, whose output is connected to the first PDU 52. The input side 46 further includes a third three-phase grid 62 providing a 200 VAC, 400 Hz power to a third transformer-rectifier unit 64, whose output is connected to the first PDU 52. A fast-charge serial communication link 66 may also be provided in communication between the transformers and the first PDU 52.

A high voltage battery pack 68 such as for example a 400 VDC, 60 kW capacity battery system is positioned between the input side 46 and an output side 70, allowing charging of the battery pack 68. A high voltage battery pack as defined herein includes a battery pack having a 400 VDC or higher output. The output side 70 includes multiple options for providing power discharge from the battery pack 68 using a second power distribution unit (PDU) 72.

The output side 70 includes a first DC-to-DC converter 74 connected to the second power distribution unit (PDU) 72 providing 28 VDC, at approximately 63 kW, with a range of 600 Amps up to 2250 Amps. The output side 70 also includes a second DC-to-DC converter 76 connected to the second power distribution unit (PDU) 72 which can provide 270 VDC, at approximately 72 kW, at a continuous 267 Amps. Multiple inverters may also be provided by the output side 70 for conversion of DC power to AC power. A first three-phase inverter 78 converts DC output from the second power distribution unit (PDU) 72 using a first transformer 80 into a first three-phase output 82 of 115/200 VAC, at 400 Hz. A second three-phase inverter 84 converts DC output from the second power distribution unit (PDU) 72 using a second transformer 86 into a second three-phase output 88 of 277/480 VAC, at 60 Hz. A one-phase inverter 90 may also be provided which converts DC output from the second power distribution unit (PDU) 72 to a convenience power output 92 of 110 VAC at 60 Hz.

Figure 3:
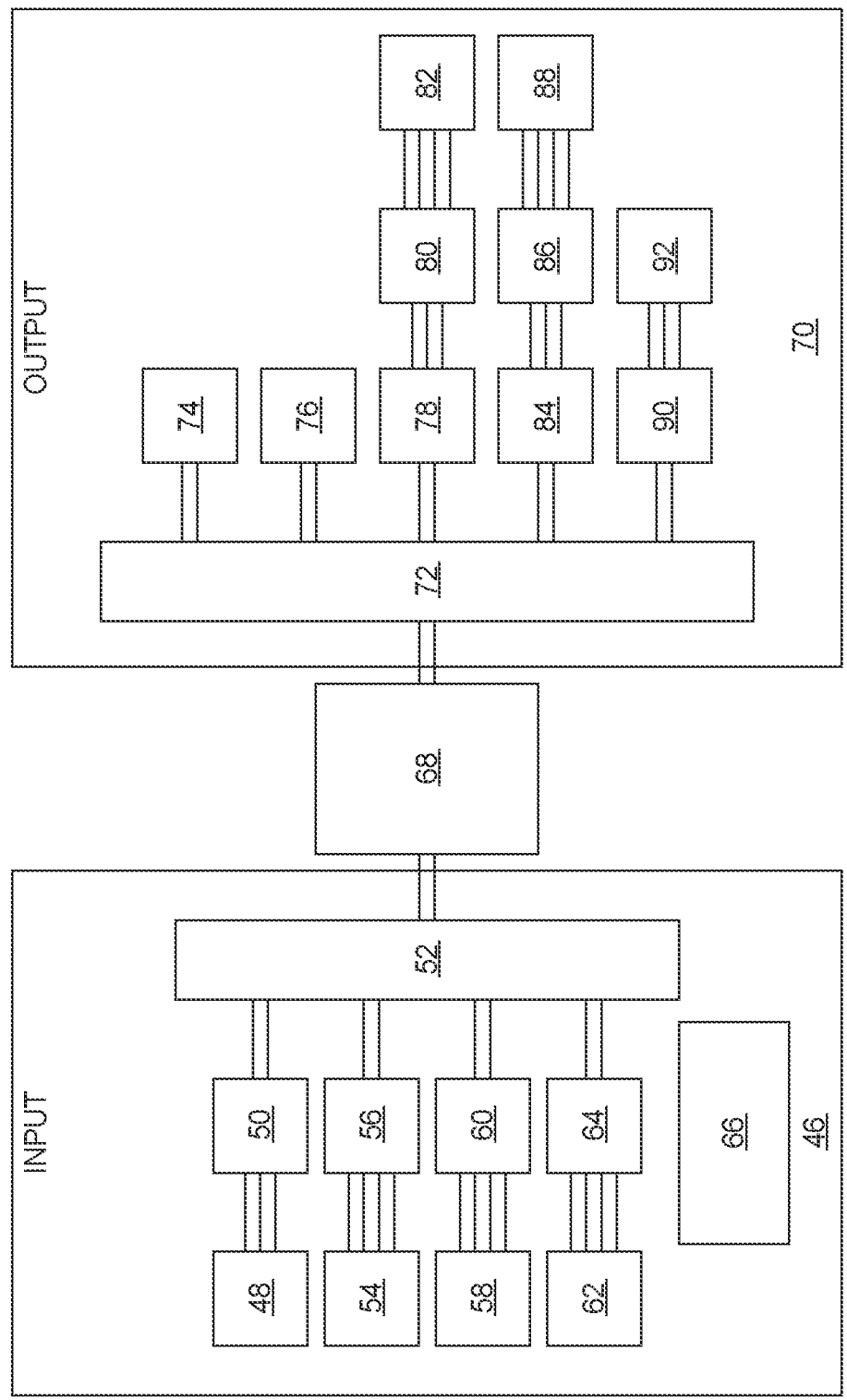
FIG. 3 is a flow diagram of an input side and an output side of the high power density electrical apparatus of FIG. 2.

Referring to FIG. 4 and again to FIGS. 1 through 3, an AC Power Module (ACPM) 93 accepts the battery pack voltage such as from the battery pack 68 described in reference to FIG. 3 at its input terminals (BAT+, BAT−) and provides galvanically isolated and regulated 3-phase 400 Hz AC output that can be selected to be 120V/200 VAC or 240V/400 VAC rms. The ACPM 93 includes multiple battery input or disconnect relays 94, inrush-current limiting through a pre-charge circuit including an EMI and battery current ripple filter 96 at its input. A high frequency PWM inverter and compact high frequency transformer 98 is followed by a rectifier and DC ripple filter 100 which generate a galvanically isolated and regulated DC voltage which is converted to 3-phase 400 Hz AC by a space vector PWM (SVPWM) inverter 102. The output of the SVPWM inverter 102 further passes through multiple output AC ripple filters 104 to produce pure sinusoidal 3-phase AC voltages at output (L1, L2, L3, N) terminals.

An auxiliary power supply on-board the "City Pod" 106 provides "house-keeping" power for a controller of the ACPM 93. A Digital Signal Processor (DSP) controller 108 monitors various electrical, thermal and user parameters and provides precision regulation of the output voltage and frequency using multiple switch-relay drivers 110, high voltage/low voltage isolators 112, multiple sensor interfaces 114, a communication and user interface 116, and a diagnostics/protection/thermal management unit 118. The ACPM 93 can also be monitored and/or controlled externally via a CAN bus 120 via the digital panel user interface 116. Switches used herein may define wide band-gap power semi-conductor switches which can be GaN or SiC switches and which operate at switching frequencies above audible range (>16 kHz).

The ACPM 93 can be either forced air cooled or liquid cooled. An aux-power connection 122, an enable connection 124 and a chassis ground 126 are also provided. The ACPM 93 implements comprehensive diagnostics, protection and thermal management features for safe and reliable operation of the DSP controller 108 based on various voltage, current and temperature sensor outputs interfaced through signal isolators to the DSP controller 108. Use of wide band-gap power semiconductors in the inverters/rectifiers and low-loss magnetic core materials in the high frequency PWM inverter and compact high frequency transformer 98 result in high power density with high efficiency (up to 94%) for the ACPM 93. The transformers used herein including the transformer 98 define high power density scalable designs operating at high frequency defined herein as greater than 4 kHz, and having a transformer mass that is at least an order of magnitude lower than that used in known power generators.

Figure 4:
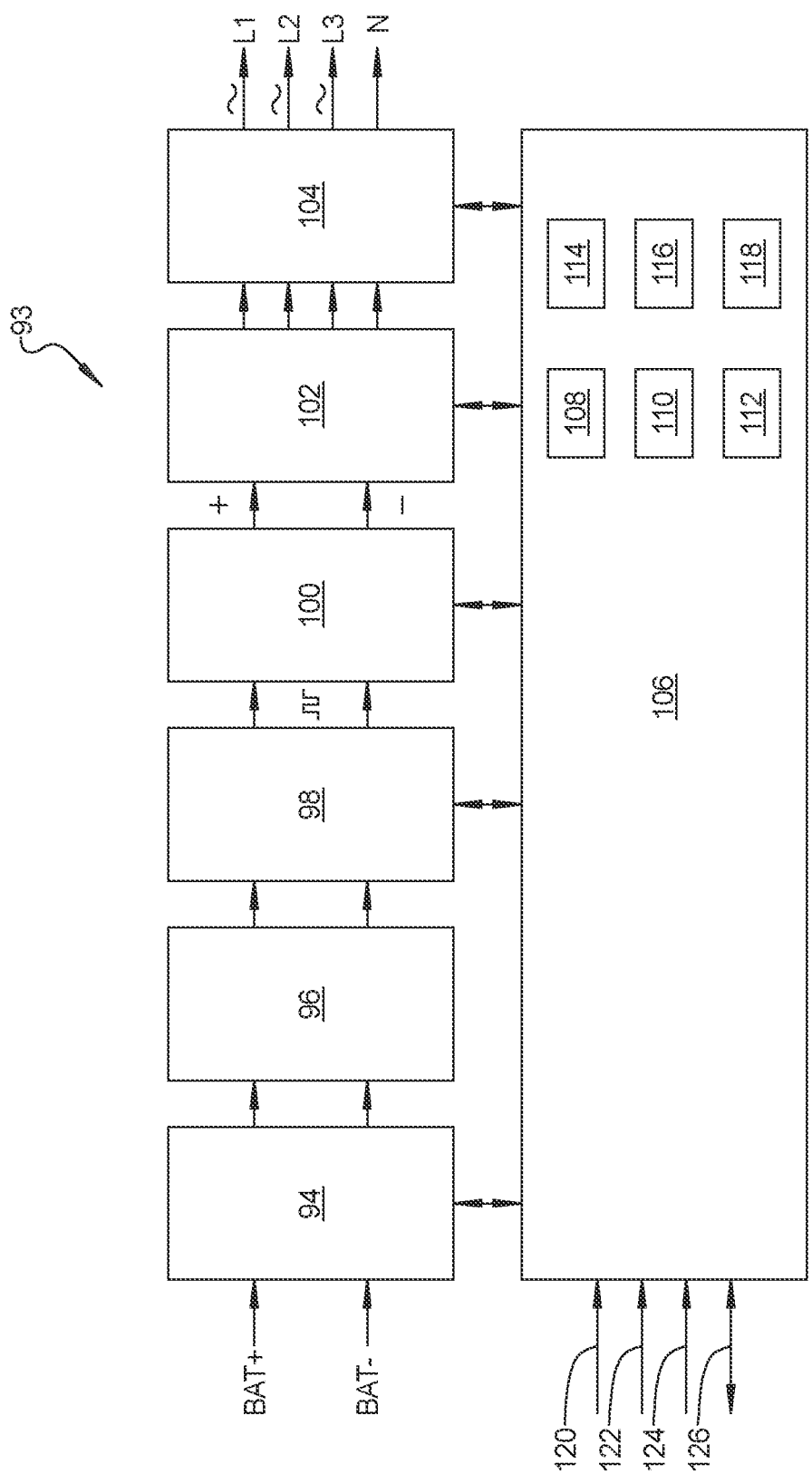
FIG. 4 is a flow diagram of an AC Power Module (ACPM) for the mobile unit of FIG. 1.
Figure 5:
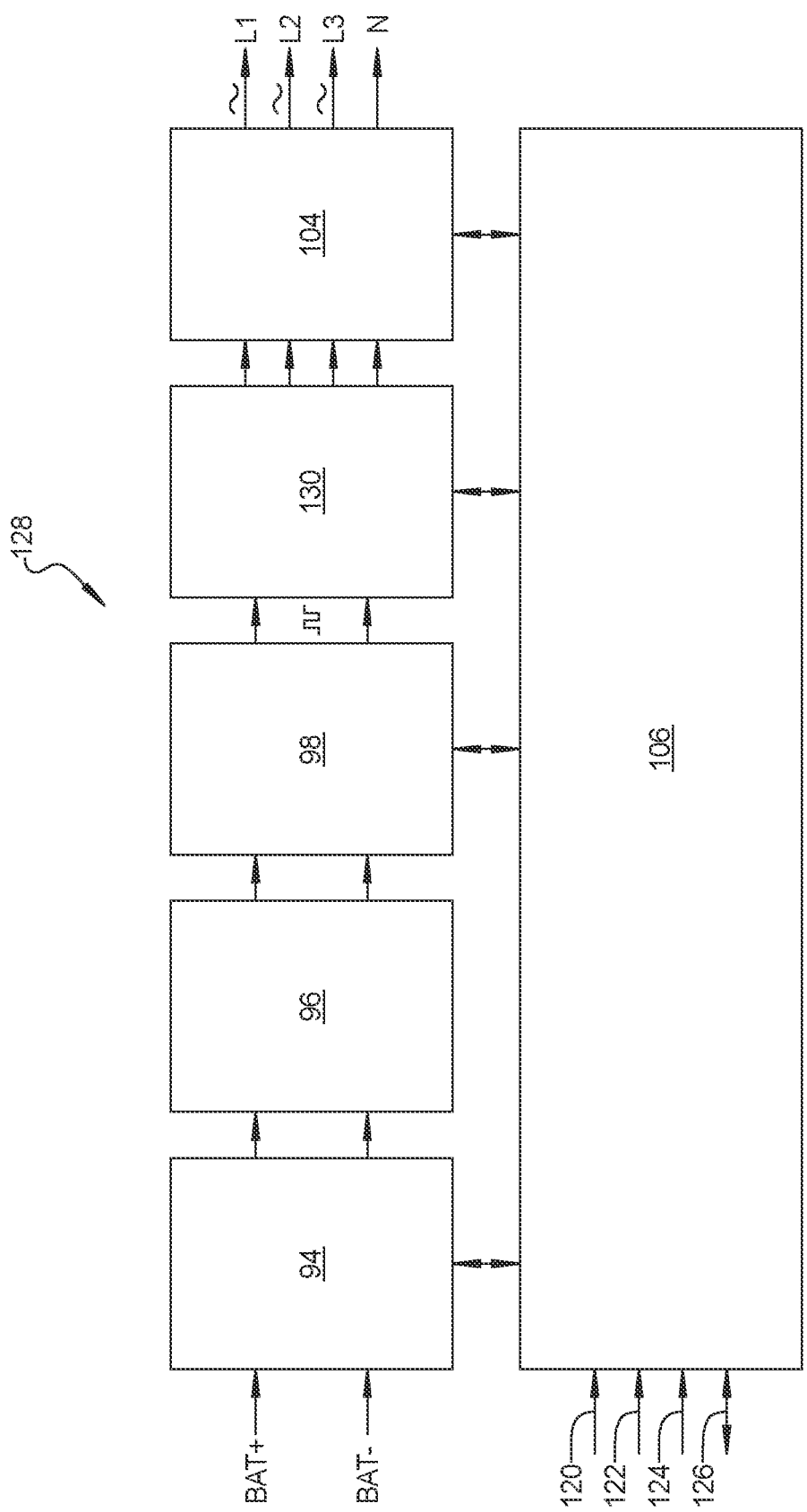
FIG. 5 is flow diagram of a second AC Power Module (ACPM) modified from the ACPM of FIG. 4

Referring to FIG. 5 and again to FIG. 4, according to several aspects, a second AC Power Module (ACPM) 128 is modified from the ACPM 93 of FIG. 4. The high frequency [>10 kHz] PWM inverter and compact high frequency transformer 98 is again used to provide galvanic isolation. The multiple battery input or disconnect relays 94, the EMI and battery current ripple filter 96, and the high frequency PWM inverter and compact high frequency transformer 98 of FIG. 4 are also retained. In lieu of the rectifier and DC ripple filter 100, and the space vector PWM inverter 102 of FIG. 4, a high frequency AC to low frequency AC conversion is accomplished using a cyclo-converter 130. The City Pod 106 of FIG. 4 is again used to monitor and control and manage power output.

Figure 6:
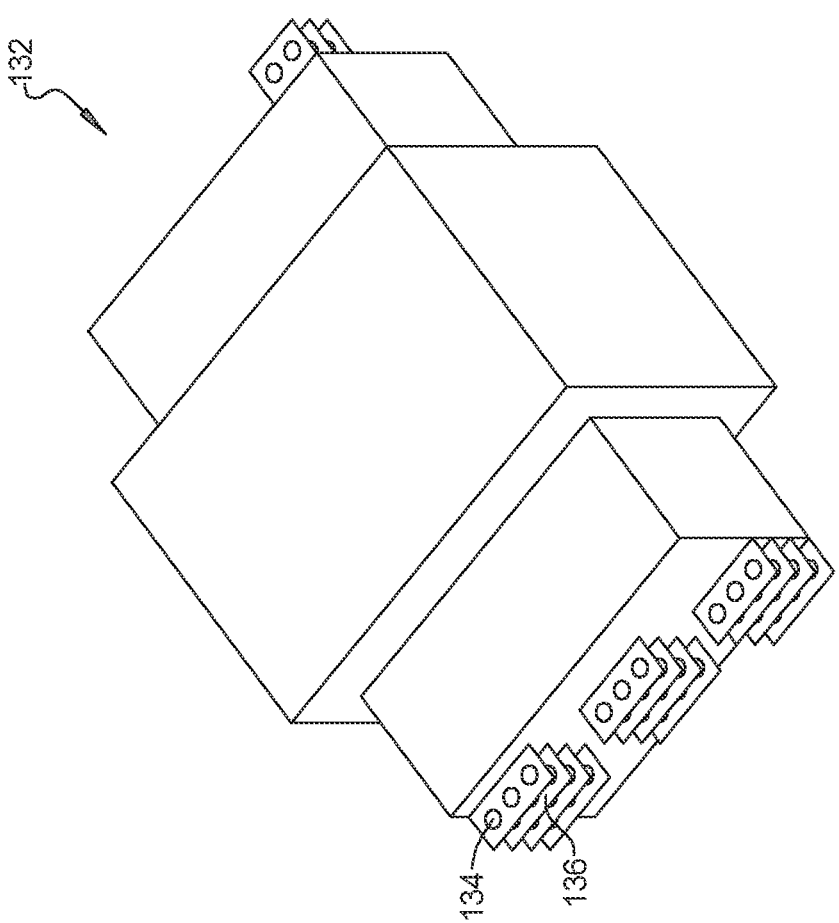
FIG. 6 is a top perspective view of a planar transformer for the ACPM of FIG. 4 and FIG. 5.

Referring to FIG. 6 and again to FIGS. 1 through 4, individual transformers for use herein may define a planar transformer 132. The planar transformer 132 defines a transformer using multiple flat windings 134, usually applied on a printed circuit board (PCB) 136 in lieu of copper wire to form the coils of the transformer as known in common coiled wire bobbin transformers. The planar transformer 132 may contain windings etched on the PCB 136 in a spiral form. The current conductors are thin sheets of copper in lieu of copper wire, therefore the operating frequency is not limited by the skin effect. DC-to-AC converters of the present disclosure built with planar transformers 132 which operate at high switching frequencies, defined herein as frequencies at or above 100 kHz, thereby reduce a space envelope and increase power density compared to use of known coiled wire bobbin transformers.

Figure 7:
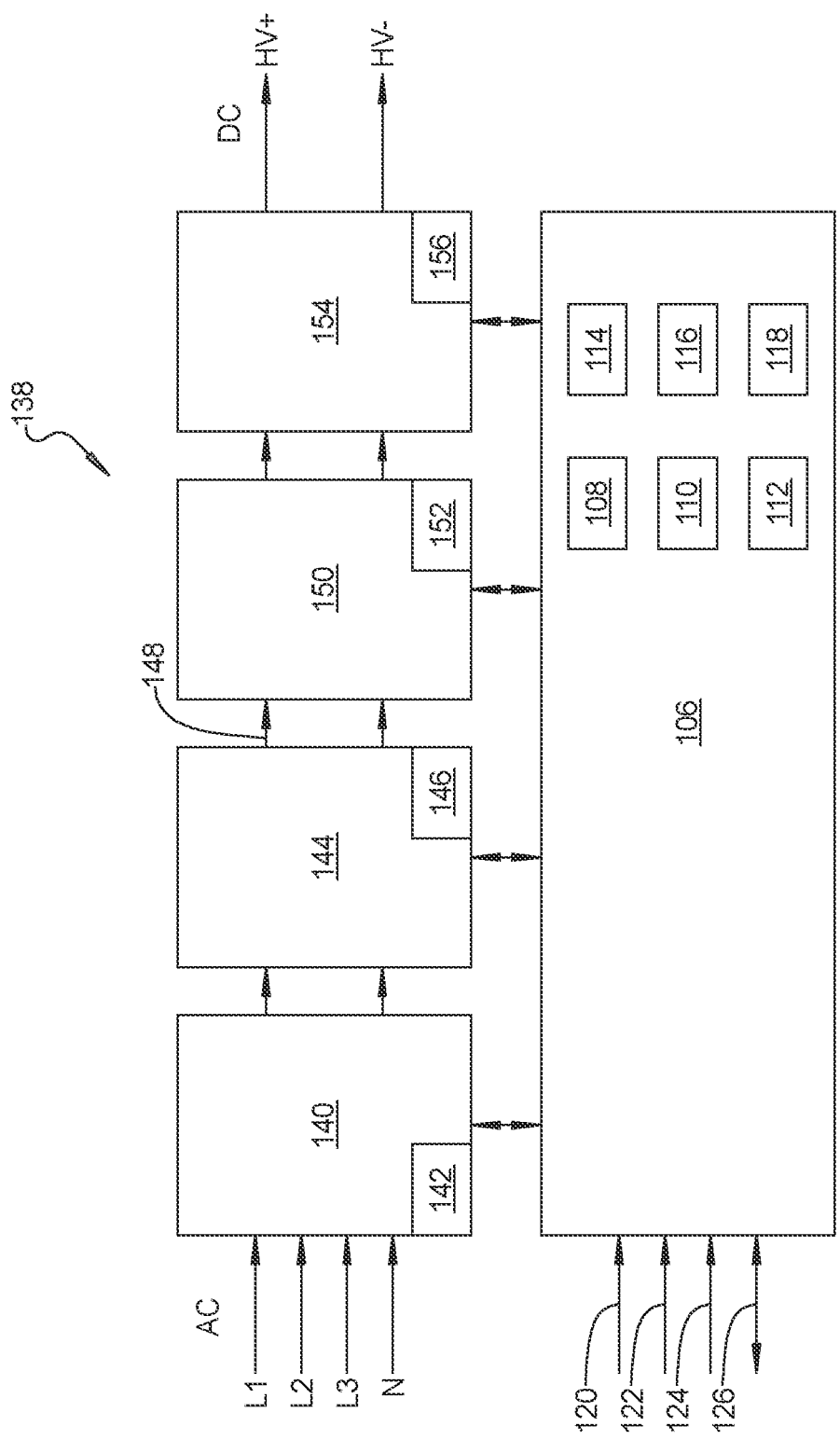
FIG. 7 is a flow diagram of an on-board charger module (OBCM) accepting either one-phase or 3-phase input at AC input terminals, and outputting galvanically isolated and regulated DC voltage and current.

Referring to FIG. 7 and again to FIG. 4, an on-board charger module (OBCM) 138 accepts either one-phase (L1, L2/N) or 3-phase input (L1, L2, L3, N) at its AC input terminals, and outputs galvanically isolated and regulated DC voltage and current that can be programmed to match the charging requirements of the battery such as the battery pack 68 connected at its output. The OBCM 138 on its input side includes multiple AC line disconnect relays 140 with inrush-current limiting through a pre-charge circuit, an EMI filter 142 followed by a power factor corrected (PFC) active rectifier 144 and one or more intermediate DC bus ripple filters 146. The input circuit provides a near unity power factor and low total harmonic distortion (THD) sinusoidal current draw from the AC input source. An intermediate DC bus 148 powers a high frequency pulse width modulated (PWM) inverter 150 connected to a compact high frequency (HF) transformer 152 followed by output rectifiers 154 and a DC ripple filter 156 to generate a galvanically isolated and regulated DC voltage at the high voltage output (HV+, HV−) terminals. The OBCM 138 can operate in constant current, constant voltage or constant power modes depending on the state-of-charge (SOC) of the battery pack 68 and a charge control algorithm within the battery management system.

The auxiliary power supply on-board the "City Pod" 106 provides the house keeping power for the controller of the OBCM 138. A Digital Signal Processor (DSP) based controller 108 monitors various electrical, thermal and user parameters and provides precision regulation of the output voltage, current or power supplied to the battery. The system can also be monitored and/or controlled externally via the CAN bus 120 and/or the digital panel user interface 116. The OBCM 138 can be either forced air cooled or liquid cooled. The DSP based controller 108 implements comprehensive diagnostics, protection and thermal management features for safe and reliable operation of the OBCM 138 based on various voltage, current and temperature sensor outputs interfaced through signal isolators to the DSP based controller 108.

Use of wide band-gap power semiconductors in the PFC active rectifier 144, the intermediate bus PWM inverter 150, the output rectifiers 154 and low-loss magnetic core materials in the high frequency transformer 152 result in high power density with high efficiency, up to 94% for three-phase input, and at least 90% for one-phase input for the OBCM 138. Output power of one-phase 240 VAC at 50 to 60 Hz input to the OBCM 138 is limited to 11 kW. Multi-phase module operation minimizes filter capacitor size.

Figure 8:
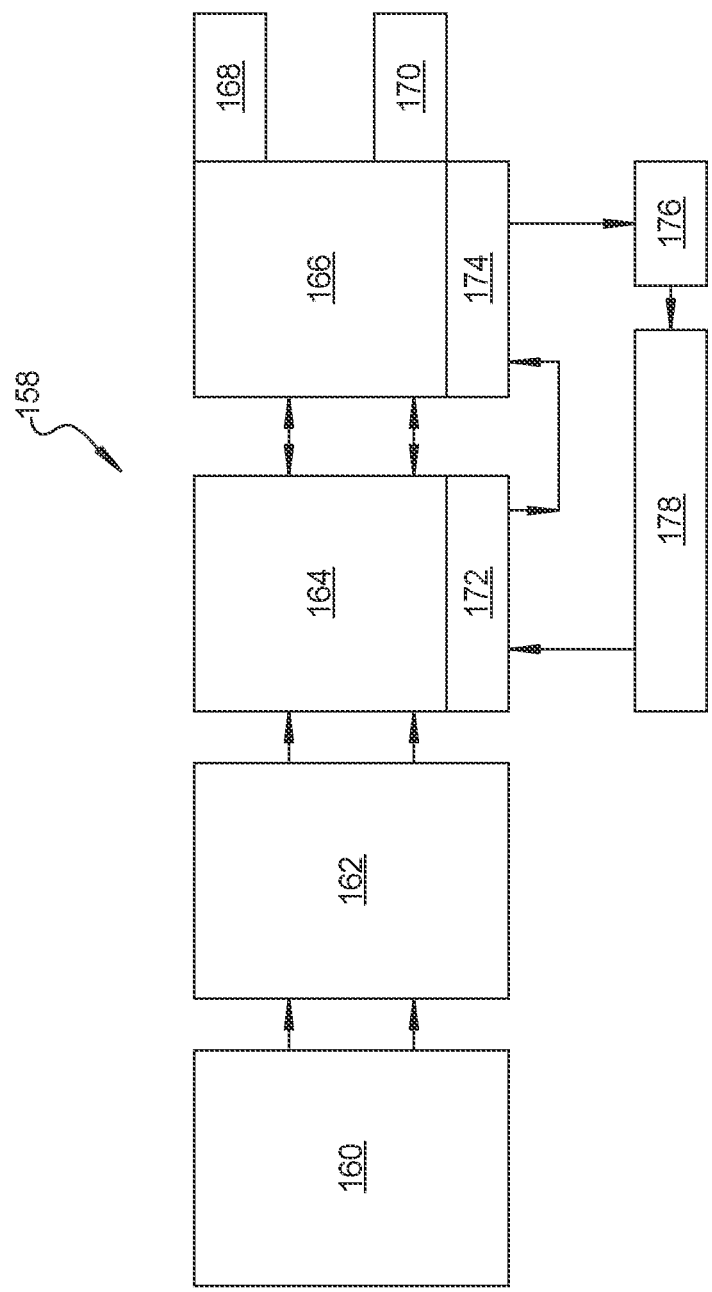
FIG. 8 is a flow diagram of a solar charging system for the mobile unit of FIG. 1.

Referring to FIG. 8 and again to FIGS. 1 through 3, a solar charging system 158 may be provided with the mobile unit 12 for charging the DC energy storage devices such as the battery pack 68. According to several aspects, a solar panel 160 is connected to a DC-to-DC converter 162, which is connected to a high voltage DC energy storage unit 164 similar to the battery pack 68. A power electronics package 166 is connected to the high voltage DC energy storage unit 164. An output port 168 and a charge port 170 are provided with the power electronics package 166. The solar panel 160 may be provided as deployable solar panels or as fixed solar panels located for example on a top or sides of the protective cover 34.

The high voltage DC energy storage unit 164 may be cooled using a first cold plate heat sink 172. A second cold plate heat sink 174 may be provided with the power electronics package 166 to provide conductive cooling. Conductive heat transfer from the first cold plate heat sink 172 and the second cold plate heat sink 174 may be provided for example using a coolant flow provided by an electric coolant pump 176 which discharges elevated temperature coolant into a radiator and fan unit 178 to reduce a temperature of the coolant before returning the coolant to the first cold plate heat sink 172 and continuing into the second cold plate heat sink 174.

Figure 9:
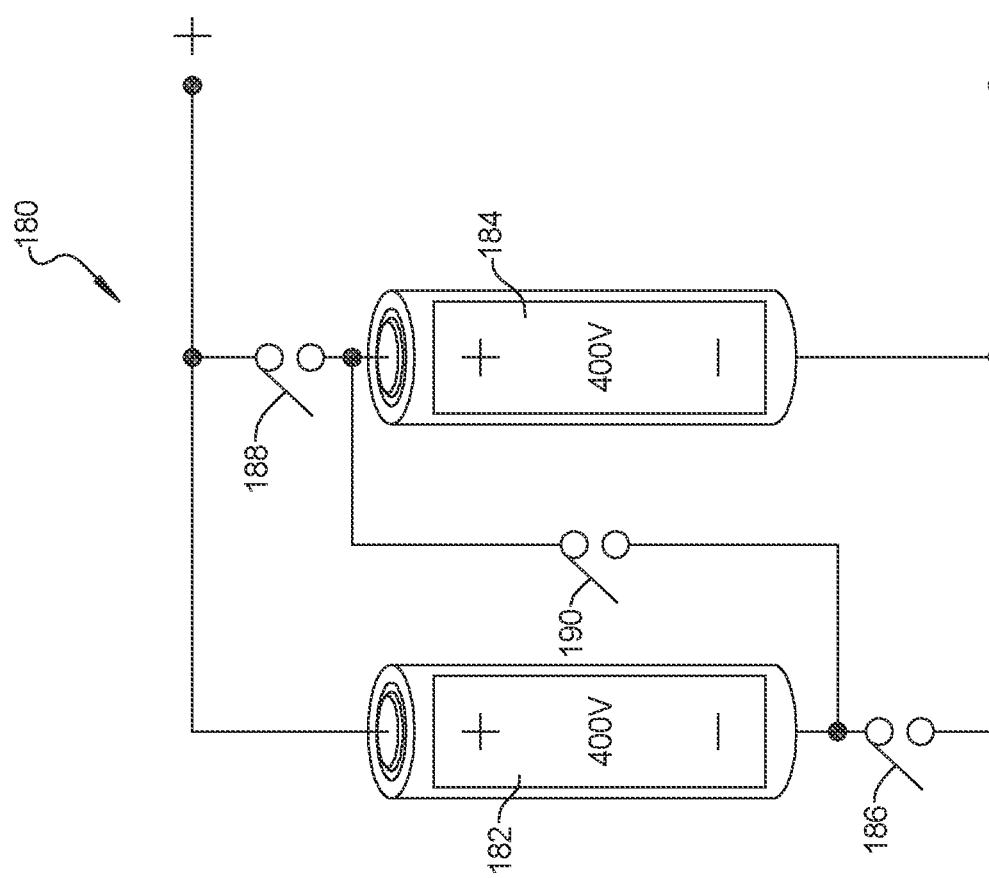
FIG. 9 is a wiring diagram for a battery voltage system of the mobile unit of FIG. 1.

Referring to FIG. 9, a selectable DC energy storage system 180 is provided for a first 400 VDC battery 182 and a second 400 VDC battery 184. A 400 volt (V) option is provided by configuring the selectable DC energy storage system 180 by positioning a first switch 186 connected across a negative terminal side of the first 400 VDC battery and the second 400 VDC battery in a closed position, a second switch 188 connected across a positive terminal side of the first 400 VDC battery and the second 400 VDC battery in a closed position and a third switch 190 connected to the negative terminal side of the first 400 VDC battery and the positive terminal side of the second 400 VDC battery in an open position. An 800V option is provided by positioning the first switch 186 in an open position, the second switch in an open position and the third switch in a closed position. An 800V option is provided by configuring the selectable DC energy storage system 180 by positioning the first switch 186 in an open position, the second switch 188 in an open position and the third switch 190 in a closed position. The 800V battery option further reduces mass of the high current conductors and their losses.

Figure 10:
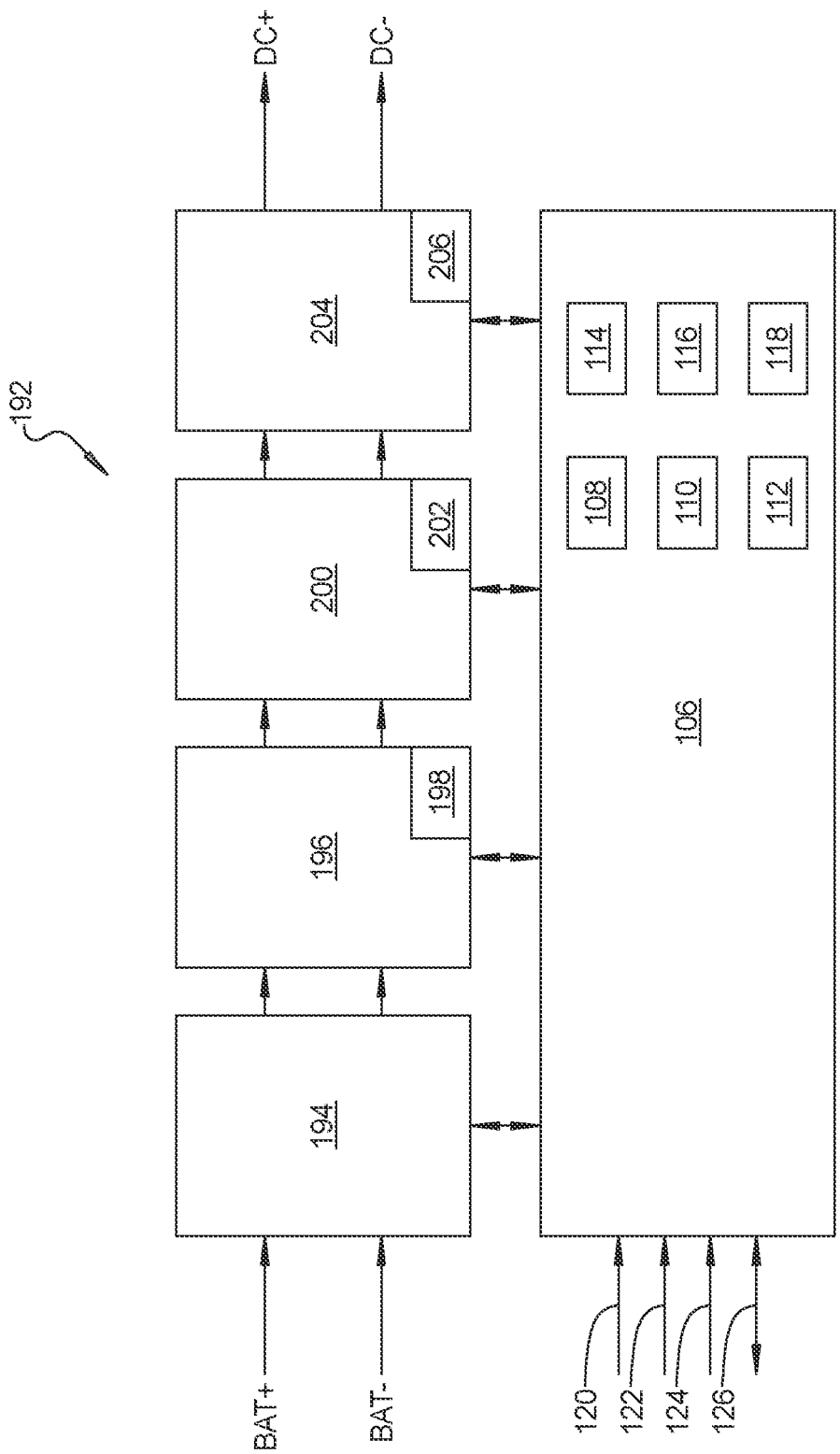
FIG. 10 is a flow diagram of a DC Power Module (DCPM) for the mobile unit of FIG. 1.

Referring to FIG. 10, according to several aspects, a DC Power Module (DCPM) 192 accepts the battery pack 68 voltage at its input terminals (BAT+, BAT−) and provides a galvanically isolated and regulated DC output that can be factory set or selectable to either 270V or 28V. The DCPM 192 includes multiple battery disconnect relays 194 with inrush-current limiting through a pre-charge circuit, an electromagnetic interference (EMI) filter 196 and a battery current ripple filter 198 at its input. A high frequency PWM inverter 200, and a compact high frequency (HF) transformer 202 are followed by a rectifier 204 and a DC ripple filter 206 to generate a galvanically isolated and regulated DC voltage which is available at the output terminals (DC+, DC−). The output of the DCPM 192 is protected against load dump, short circuit, over voltage and over-current and meets all MIL-STD-704F requirements.

An auxiliary power supply on-board the "City Pod" 106 provides the house keeping power for the controller of the DCPM 192. The Digital Signal Processor (DSP) based controller 108 monitors various electrical, thermal and user parameters and provides precision regulation of the output voltage for load currents within set limits. The DCPM 192 can also be monitored and/or controlled externally via the CAN bus 120 and/or the digital panel user interface 116. The DCPM 192 can be either forced air cooled or liquid cooled. The DSP based controller 108 implements comprehensive diagnostics, protection and thermal management features for safe and reliable operation of the DCPM 192 based on various voltage, current and temperature sensor outputs interfaced through signal isolators to the DSP.

Use of wide band-gap power semiconductors in the inverters/rectifiers and low-loss magnetic core materials in the high frequency transformer result in high power density with high efficiency (up to 95% for 270 VDC output and at least 90% for the 28 VDC output) for the DCPM.

A mobile power source apparatus 10 of the present disclosure incorporates the following features.

A high efficiency eGPU using wide band-gap power semi-conductor switches. The switches can be GaN or SiC operating at switching frequencies above audible range (>16 kHz). High power density is provided through a scalable design using high frequency (>4 kHz) isolation transformers. Transformer mass is at least an order of magnitude lower than that used in known bobbin wire coil transformers. Planar magnetics and power switches mounted on a liquid cooled base plate provide efficient cooling, using the same coolant loop as the DC energy storage system.

A modular integrated assembly is provided with minimal interconnects. A selectable higher voltage (800V) battery option is available for further reducing mass of high current conductors and their losses. A dual active bridge or a logical link control (LLC) resonant DC-DC stage is provided for minimum losses in the high frequency power conversion stage. Multi-phase module operation minimizes filter capacitor size. Reduced filter size is provided based on high switching frequency for fast transient response. Fault tolerance is provided by individual phase control in a 3-phase power output. High bandwidth current sensing and digital signal processor-based control is provided for high power quality with very low harmonic distortion.

A wireless communication of battery SOC to eGPU human machine interface (HMI) aspect is provided. Thermal pre-conditioning of DC energy storage with Li batteries is provided for optimal performance. A deployable or a fixed solar panel is provided (top/sides) for recharging the DC energy storage. Field service lifting features 41 are integrated with the energy storage and power electronics. A safety interlock feature prevents driving the eGPU away when it is plugged into a load or a charger.

A mobile power source of the present disclosure offers several advantages. These include a mobile power source using liquid cooled HV DC energy storage to provide clean power that can readily be converted to an AC or DC voltage. The present mobile power source provides wide band-gap power devices (SiC or GaN) operating at several kHz coupled with high frequency planar magnetics for high efficiency. The present mobile power source also includes a shared liquid cooling system for the energy storage system and for power electronics for high power density. Values of current, voltage, power level, frequency and the like identified herein are provided as "nominal" values, herein defined as example values which can also vary above or below the designated value, values or ranges provided within the scope of the present disclosure. The mobile power source of the present disclosure is therefore not limited to the "nominal" values and may therefore be modified to produce or operate at any desired value of power, current, power level and frequency.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A mobile power source, comprising:
   a mobile unit having a platform structure, a frame connected to the platform structure supporting a towing adapter to move the mobile unit, and multiple wheels rotatably connected to the platform structure to promote moving the mobile unit;
   an electronics power module connected to a DC power source defining a high voltage DC battery, the electronics power module converting DC energy of the DC battery to at least one of an alternating current (AC) power and a direct current (DC) power, wherein the electronics power module also controls recharging of the high voltage DC battery;
   an AC Power Module (ACPM) accepting a battery voltage at input terminals (BAT+, BAT−) and providing a galvanically isolated and regulated nominal 3-phase 400 Hz AC output that is selected to be one of a nominal 120V/200 VAC and 240V/400 VAC rms, wherein the ACPM includes multiple disconnect relays and inrush-current limiting through a pre-charge circuit including an EMI and battery current ripple filter input; and
   a PWM inverter and a high frequency transformer followed by a rectifier and a DC ripple filter to generate a galvanically isolated and regulated DC voltage, the DC voltage converted to a nominal 3-phase 400 Hz AC voltage by a space vector PWM inverter, wherein an output of the space vector PWM inverter passed through multiple output AC ripple filters produces sinusoidal 3-phase AC voltages.

2. The mobile power source of claim 1, further comprising:
   a power electronics configuration of a battery charging system of an AC power source to DC power for power delivery to a vehicle; and
   an input side providing power from a one-phase grid which can be a nominal one of a 120 VAC, 60 Hz source; and a 240 VAC, 60 Hz source, and
   wherein the one-phase grid is tied to an on-board-charging-module converting the AC power source to a DC current, the DC current fed into a first power distribution unit (PDU).

3. The mobile power source of claim 2, wherein the input side further includes:
   a first three-phase grid providing a nominal 208 VAC, 60 Hz power to a first transformer-rectifier unit whose output is connected to the first PDU;
   a second three-phase grid providing a nominal 480 VAC, 60 Hz power to a second transformer-rectifier unit connected to the first PDU; and
   a third three-phase grid providing a nominal 200 VAC, 400 Hz power to a third transformer-rectifier unit connected to the first PDU.

4. A mobile power source, comprising:
   a mobile unit having a platform structure, a frame connected to the platform structure supporting a towing adapter to move the mobile unit, and multiple wheels rotatably connected to the platform structure to promote moving the mobile unit;
an electronics power module connected to a DC power source defining a high voltage DC battery, the electronics power module converting DC energy of the DC battery to at least one of an alternating current (AC) power and a direct current (DC) power, wherein the electronics power module also controls recharging of the high voltage DC battery; and
a wireless communication device to promote wireless communication of a battery state-of-charge (SOC) of the high voltage DC battery to monitor and to identify an available charging condition of the mobile unit prior to deployment.

5. A mobile power source, comprising:
a mobile unit having a platform structure, a frame connected to the platform structure supporting a towing adapter to move the mobile unit, and multiple wheels rotatably connected to the platform structure to promote moving the mobile unit;
an electronics power module connected to a DC power source defining a high voltage DC battery, the electronics power module converting DC energy of the DC battery to at least one of an alternating current (AC) power and a direct current (DC) power, wherein the electronics power module also controls recharging of the high voltage DC battery; and
a safety interlock feature preventing moving the mobile unit when the mobile unit is plugged into at least one of a load and a charger; and
the safety interlock feature also defining a manual service disconnect to manually isolate the battery.

6. A mobile power source, comprising:
a mobile unit having a platform structure, a frame connected to the platform structure supporting a towing adapter to move the mobile unit, and multiple wheels rotatably connected to the platform structure to promote moving the mobile unit;
an electronics power module connected to a DC power source defining a high voltage DC battery, the electronics power module converting DC energy of the DC battery to at least one of an alternating current (AC) power and a direct current (DC) power, wherein the electronics power module also controls recharging of the high voltage DC battery; and
wide band-gap power semi-conductor switches including GaN and SiC switches operating at switching frequencies above an audible range (>16 kHz).

7. A mobile power source, comprising:
a mobile unit having a platform structure, a frame connected to the platform structure supporting a towing adapter to move the mobile unit, and multiple wheels rotatably connected to the platform structure to promote moving the mobile unit;
an electronics power module connected to a DC power source defining a high voltage DC battery, the electronics power module converting DC energy of the DC battery to at least one of an alternating current (AC) power and a direct current (DC) power, wherein the electronics power module also controls recharging of the high voltage DC battery; and
at least one transformer defining at least one high power density transformer operating at a frequency greater than 4 kHz.

8. A mobile power source, comprising:
a mobile unit having a platform structure, a frame connected to the platform structure supporting a towing adapter to move the mobile unit, and multiple wheels rotatably connected to the platform structure to promote moving the mobile unit; and
an electronics power module connected to a DC power source defining a high voltage DC battery, the electronics power module converting DC energy of the DC battery to at least one of an alternating current (AC) power and a direct current (DC) power, wherein the electronics power module also controls recharging of the high voltage DC battery;
wherein the high voltage DC battery defines a selectable DC energy storage system having a first nominal 400 VDC battery and a second nominal 400 VDC battery;
wherein a 400V option is provided by positioning a first switch connected across a negative terminal side of the first nominal 400 VDC battery and the second nominal 400 VDC battery in a closed position, a second switch connected across a positive terminal side of the first nominal 400 VDC battery and the second nominal 400 VDC battery in a closed position and a third switch connected to the negative terminal side of the first nominal 400 VDC battery and the positive terminal side of the second nominal 400 VDC battery in an open position; and
wherein an 800V option is provided by positioning the first switch in an open position, the second switch in an open position and the third switch in a closed position.

9. A mobile power source, comprising:
a mobile unit having a platform structure, a frame connected to the platform structure and multiple wheels rotatably connected to the platform structure to promote moving the mobile unit;
an electronics power module connected to a DC power source defining a high voltage DC battery having a nominal voltage of 400 VDC or greater, the electronics power module converting DC energy of the DC battery to at least one of an alternating current (AC) power and a direct current (DC) power;
a wireless communication device to promote wireless communication of a battery state-of-charge (SOC) of the high voltage DC battery; and
a liquid cooling thermal system providing positive cooling of the electronics power module.

10. The mobile power source of claim 9, including:
a high voltage DC energy storage unit having a nominal voltage of 400 VDC or greater cooled using a first cold plate heat sink; and
a power electronics package cooled using a second cold plate heat sink.

11. The mobile power source of claim 9, including:
a DC Power Module (DCPM) accepting a battery voltage at input terminals (BAT+, BAT−) and providing a galvanically isolated and regulated DC output selected to a nominal one of 270V and 28V, the DCPM including:
multiple battery disconnect relays with inrush-current limiting through a pre-charge circuit;
an EMI filter and a battery current ripple filter;
a PWM inverter; and
a HF transformer followed by a rectifier and a DC ripple filter to generate a galvanically isolated and regulated DC voltage.

12. The mobile power source of claim 9, including a solar charging system provided with the mobile unit charging the high voltage DC battery.

13. The mobile power source of claim 12, the solar charging system including:

a solar panel;

a DC-to-DC converter connected to the solar panel;

a power electronics package connected to the high voltage DC battery; and an output port and a charge port provided with the power electronics package.

14. The mobile power source of claim 9, including a towing adapter releasably connected to a towing vehicle used to move the mobile unit.

15. The mobile power source of claim 9, wherein the liquid cooling thermal system includes:

a pump inducing flow of a liquid coolant; and a radiator providing for heat transfer of heat from the liquid coolant to atmosphere.

16. A method for generating power using a mobile power source, comprising:

connecting a frame of a mobile unit to a platform structure and rotatably connecting multiple wheels to the platform structure to promote moving the mobile unit;

providing an electronics power module connected to a DC power source defining a high voltage DC battery having a nominal voltage of 400 VDC or greater, and converting DC energy of the DC battery to at least one of an alternating current (AC) power and a direct current (DC) power using the electronics power module;

wirelessly communicating a battery state-of-charge (SOC) of the high voltage DC battery using a wireless communication device; and positively cooling the electronics power module using a liquid cooling thermal system.

17. The method of claim 16, further including connecting a solar charging system with the mobile unit to charge the high voltage DC battery.

18. The method of claim 16, further including selecting one of:

a DC Power Module (DCPM) accepting a battery voltage at input terminals (BAT+, BAT−) and providing a galvanically isolated and regulated nominal DC output selected to either 270V or 28V; and an AC Power Module (ACPM) accepting a battery voltage at the input terminals (BAT+, BAT−) and providing a galvanically isolated and a nominal regulated 3-phase 400 Hz AC output that is selected to be 120V/200 VAC or 240V/400 VAC rms.

* * * * *